United States Patent
Fan et al.

(10) Patent No.: US 11,507,347 B2
(45) Date of Patent: Nov. 22, 2022

(54) FULL ADDER, CHIP AND COMPUTING DEVICE

(71) Applicant: SHENZHEN MICROBT ELECTRONICS TECHNOLOGY CO., LTD., Guangdong (CN)

(72) Inventors: Zhijun Fan, Guangdong (CN); Weixin Kong, Guangdong (CN); Dong Yu, Guangdong (CN); Zuoxing Yang, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/628,476

(22) PCT Filed: May 14, 2021

(86) PCT No.: PCT/CN2021/093743
§ 371 (c)(1),
(2) Date: Jan. 19, 2022

(87) PCT Pub. No.: WO2022/001414
PCT Pub. Date: Jan. 6, 2022

(65) Prior Publication Data
US 2022/0269481 A1    Aug. 25, 2022

(30) Foreign Application Priority Data

Jun. 30, 2020  (CN) .......................... 202010613164.7

(51) Int. Cl.
*G06F 7/503*    (2006.01)
*H03K 19/20*    (2006.01)
(52) U.S. Cl.
CPC ............. *G06F 7/503* (2013.01); *H03K 19/20* (2013.01)

(58) Field of Classification Search
CPC ................................ G06F 7/503; H03K 19/20
(Continued)

(56) References Cited

U.S. PATENT DOCUMENTS

| 6,130,559 A * | 10/2000 | Balsara ................. B82Y 10/00 |
| | | 708/505 |
| 2005/0102346 A1* | 5/2005 | Belluomini ............. G06F 7/607 |
| | | 708/708 |

(Continued)

FOREIGN PATENT DOCUMENTS

| CN | 102739237 A | 10/2012 |
| CN | 102882513 A | 1/2013 |

(Continued)

OTHER PUBLICATIONS

International Search Report and Written Opinion dated Aug. 12, 2021 in International Application No. PCT/CN2021/093743.
(Continued)

*Primary Examiner* — Tan V Mai
(74) *Attorney, Agent, or Firm* — Venable LLP

(57) ABSTRACT

Full adder, a chip and a computing device are disclosed. A full adder includes: a plurality of primary logic cells and at least one secondary logic cell, wherein an output terminal of each primary logic cell is at least connected to an input terminal of a first secondary logic cell in the at least one secondary logic cell. The plurality of primary logic cells includes: a first primary logic cell, a second primary logic cell and a third primary logic cell respectively configured to generate a first intermediate signal, a second intermediate signal and a carry-related signal based on a first input signal, a second input signal and a carry input signal input to the full adder. Furthermore, the first secondary logic cell is configured to generate a sum output signal of the full adder based (Continued)

on the first intermediate signal, the second intermediate signal and the carry-related signal.

12 Claims, 6 Drawing Sheets

(58) Field of Classification Search
USPC .................................... 708/230, 706, 709
See application file for complete search history.

(56) References Cited

U.S. PATENT DOCUMENTS

| | | | |
|---|---|---|---|
| 2013/0117345 A1* | 5/2013 | Ziaur Rahman | G06F 7/506 |
| | | | 708/706 |
| 2018/0157621 A1 | 6/2018 | Shu et al. | |
| 2020/0065065 A1* | 2/2020 | Wei | H03K 19/01742 |

FOREIGN PATENT DOCUMENTS

| | | |
|---|---|---|
| CN | 202798662 U | 3/2013 |
| CN | 103078629 A | 5/2013 |
| CN | 111313890 A | 6/2020 |
| CN | 111614350 A | 9/2020 |
| CN | 212726990 U | 3/2021 |

OTHER PUBLICATIONS

First Office Action dated Mar. 7, 2022 in Taiwanese Patent Application No. 110117402.

* cited by examiner

| Input | | | Output | |
|---|---|---|---|---|
| $C_{in}$ | A | B | SUM | $C_{out}$ |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

US 11,507,347 B2

FULL ADDER, CHIP AND COMPUTING DEVICE

CROSS-REFERENCE TO RELATED APPLICATIONS

The present application is a National Stage Entry of International Application No. PCT/CN2021/093743 filed May 14, 2021, which claims priority to Chinese Patent Application No. 202010613164.7 filed Jun. 30, 2020, the contents of which are hereby incorporated by reference in their entireties.

The present application is based on the application with a CN application number of 202010613164.7 and the filing date being Jun. 30, 2020, and claims its priority. The disclosure of this CN application as a whole is incorporated into the present application herein by reference.

TECHNICAL FIELD

The present disclosure relates generally to a full adder. Particularly, it relates to a full adder for improving balance, a chip including the full adder, and a computing device including the chip.

BACKGROUND

A full adder is a binary addition circuit capable of calculating a low-bit carry. Compared with a half adder, the full adder concerns not only whether the carry exists in the calculation result of the home bit, but also the carry of the previous bit to the home bit. Cascading multiple one-bit full adders can result in a multi-bit full adder. Hereinafter, a full adder refers to a one-bit full adder unless specifically noted.

FIG. 1A shows a schematic diagram of a full adder. In general, a full adder may be implemented with an electronic circuit having three inputs and two outputs. Where on the input side, A, B represent two addends and $C_{in}$ represents the carry from the adjacent lower bit. Correspondingly, on the output side, SUM represents the sum of the home bit, and $C_{out}$ represents the carry to the adjacent higher bit.

FIG. 1B shows a truth table of a full adder. As shown in FIG. 1B, when the number of items having a logic value "1" among A, B, $C_{in}$ on the input side is an odd number, the value of SUM will be "1". Otherwise, the value of SUM will be "0". Further, when the number of items having a logic value "1" among A, B, $C_{in}$ on the input side exceeds 1, the value of $C_{out}$ will be "1", otherwise, the value of $C_{out}$ will be "0".

Typical sum logic expression and carry logic expression in a full adder are as follows:

$$SUM = A \oplus B \oplus C_{in} \quad (1\text{-}1);$$

$$C_{out} = AB + (A+B)C_{in} \quad (2\text{-}1).$$

Wherein, a typical carry logic expression (2-1) can also be expressed as:

$$C_{out} = AB + (A \oplus B)C_{in} \quad (2\text{-}2).$$

SUMMARY

According to an aspect of the present disclosure, there is provided a full adder including: a plurality of primary logic cells and at least one secondary logic cell, wherein an output terminal of each primary logic cell is at least connected to an input terminal of a first secondary logic cell in the at least one secondary logic cell. The plurality of primary logic cells includes: a first primary logic cell configured to generate a first intermediate signal M based on a first input signal A, a second input signal B, and a carry input signal $C_{in}$ input to the full adder; a second primary logic cell configured to generate a second intermediate signal N based on the first input signal A, the second input signal B, and the carry input signal $C_{in}$; and a third primary logic cell configured to generate a carry-related signal C based on the first input signal A, the second input signal B and the carry input signal $C_{in}$. Furthermore, the first secondary logic cell is configured to generate a sum output signal SUM of the full adder based on the first intermediate signal M, the second intermediate signal N and the carry-related signal C.

According to another aspect of the present disclosure, there is provided a chip comprising the full adder as described above.

According to yet another aspect of the present disclosure, there is provided a computing device comprising the chip as described above.

Other features of the present disclosure and advantages thereof will become more apparent from the following detailed description of exemplary embodiments thereof with reference to the accompanying drawings.

BRIEF DESCRIPTION OF THE DRAWINGS

The drawings, which constitute a part of this description, illustrate embodiments of the present disclosure and together with the description, serve to explain the principles of the present disclosure.

The present disclosure may be more clearly understood from the following detailed description with reference to the drawings, wherein.

Figures 1A, 1B:
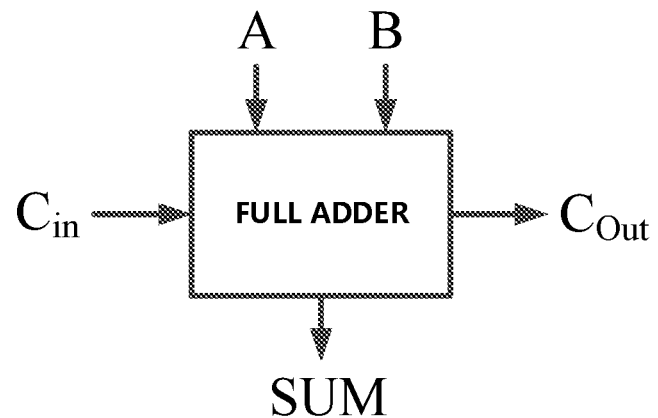
FIG. 1A shows a schematic diagram of a full adder.
FIG. 1B shows a truth table of a full adder.

Note that in the embodiments described below, the same reference sign is used in common between different drawings to denote the same part or parts having the same function, with omission of repeated description thereof. In some cases, similar marks and letters represent similar items, so once a certain item is defined in one figure, no further discussion on it is required in the following figures.

For convenience of understanding, the positions, sizes, ranges, and the like of the respective structures shown in the drawings and the like sometimes do not indicate actual positions, sizes, ranges, and the like. Therefore, the present disclosure is not limited to the positions, sizes, ranges and the like as disclosed in the drawings and the like.

DETAILED DESCRIPTION

As a basic logic circuit, a full adder is widely used in various electronic devices. For full adders, improving balance and reducing glitches are important challenges. Therefore, there is a need for new technologies.

The inventor of the present application has recognized that conventional full adders face significant challenges in terms of balance.

Figure 2:
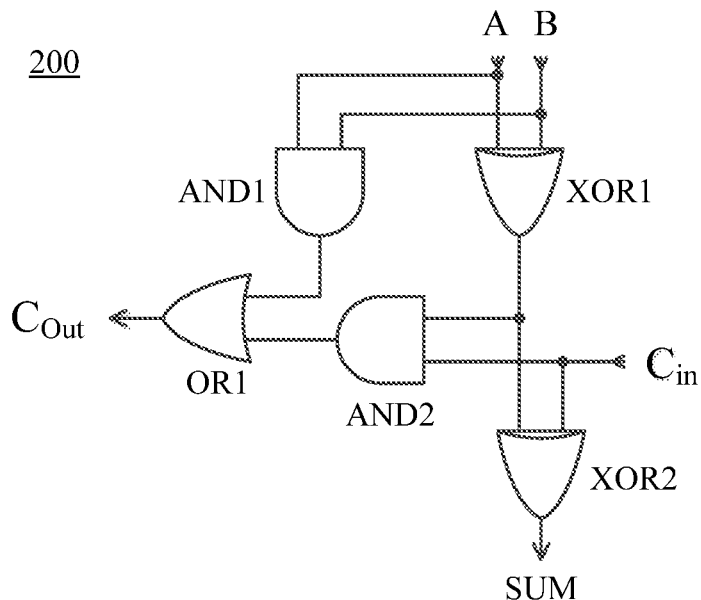
FIG. 2 shows a logic circuit diagram of one implementation of a full adder in the related art.

FIG. 2 shows a logic circuit diagram of one implementation of a full adder in the related art. The logic circuit is implemented based on the logic relationship in the above logic expressions (1-1) and (2-2).

As shown in FIG. 2, a full adder 200 includes a first XOR gate XOR1, a second XOR gate XOR2, a first AND gate AND1, a second AND gate AND2, and a first OR gate OR1. Wherein the signals A and B respectively representing two addends are input to two input terminals of the first XOR gate XOR1, an output terminal of the first XOR gate XOR1 is connected to an input terminal of the second XOR gate XOR2, and the signal $C_{in}$ representing the carry from the adjacent lower bit is input to the other input terminal of the second XOR gate XOR2. The sum output signal SUM representing the sum is thus obtained at the output terminal of the second XOR gate XOR2.

Further, the signals A and B are input to two input terminals of the first AND gate AND1, and an output terminal of the first AND gate AND1 is connected to an input terminal of the first OR gate OR1; an output terminal of the first XOR gate XOR1 is connected to an input terminal of a second AND gate AND2, the signal $C_{in}$ is input to the other input terminal of the second AND gate AND2, and an output terminal of the second AND gate AND2 is connected to the other input terminal of the first OR gate OR1. Thereby, a carry output signal $C_{out}$ representing the carry to the adjacent higher bit is obtained at the output terminal of the first OR gate OR1.

Figure 3:
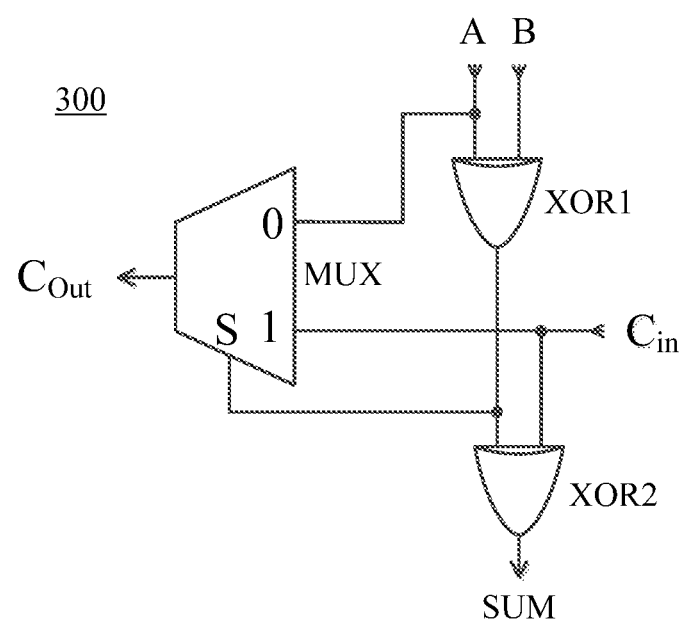
FIG. 3 shows a logic circuit diagram of another implementation of a full adder in the related art.

FIG. 3 shows a logic circuit diagram of another implementation of a full adder in the related art.

The implementation shown in FIG. 3 differs from the implementation shown in FIG. 2 mainly in that the following variant of the above logic expression (2-1)/(2-2) is utilized to derive the carry output signal $C_{out}$. Specifically, the carry $C_{out}$ can also be expressed as:

$$C_{out}=(A\oplus B)C_{in}+(\overline{A\oplus B})A \quad (2\text{-}3).$$

That is, when $A\oplus B=1$ is satisfied, the logic value of $C_{out}$ depends on $C_{in}$, otherwise, the logic value of $C_{out}$ depends on A.

As shown in FIG. 3, a full adder 300 includes a first XOR gate XOR1, a second XOR gate XOR2, and a multiplexer MUX.

The implementation of the sum logic operation shown in FIG. 3 is substantially the same as that shown in FIG. 2 based on the same logic expression (1-1), and a description thereof will not be repeated.

Furthermore, the signal A and the signal $C_{in}$ are input to two channel input terminals of the multiplexer MUX, respectively, and the output terminal of the first XOR gate XOR1 is connected to a channel selection terminal of the multiplexer MUX. Thus, a carry output signal $C_{out}$ representing the carry to the adjacent higher bit is obtained at the output terminal of the multiplexer MUX based on the logic expression (2-3).

The above-described full adder in the related art is implemented based on the typical sum logic expression (1-1) and carry logic expressions (2-1)-(2-3), and the design concept of the logic circuit is relatively simple.

However, the inventor of the present application has recognized that "glitches" are prevalent in the output signal obtained from these implementations. On one hand, the existence of relative delays between the various signals that participate in logic operations of "AND", "OR" or a combination thereof, in the same logic cell may cause glitches. On the other hand, the poor balance of some logic cells (the delay characteristic is affected by the input signals) may also introduce glitches in subsequent processing. Moreover, the full adders in these implementations are also unbalanced as a whole, which would be detrimental to the cascade arrangement.

For example, the XOR gate logic cells commonly used in these implementations are unbalanced and the logic operations performed therein may produce glitches in the output signal.

The first XOR gate XOR1 will be analyzed as an example below. Assuming that the output signal of the first XOR gate XOR1 is S, S satisfies the following logic relationship:

$$S=A\oplus B=A\overline{B}+\overline{A}B \quad (3).$$

Note that the signals for the logic operations of "AND", "OR" or a combination thereof in the first XOR gate XOR1 include not only the signals A and B directly input to the first XOR gate XOR1, but also inverted signals $\overline{A}$ and $\overline{B}$ obtained by inversion of the signals A and B. Since it is generally necessary to use an inverter, which will introduce a certain amount of delay, to invert the signals, a relative delay between the signals A, B and the inverted signals $\overline{A}$, $\overline{B}$ is produced. For example, in some embodiments, the delay is on the order of about 100 ps. Generally, the magnitude of the relative delay is not negligible for the logic operation in the cell, which may destroy the synchronization between the signals. Thus, the output signal S of the first XOR gate XOR1 will likely contain glitches. In addition, based on the logic expression (3), the first XOR gate XOR1 itself is unbalanced, a logic cell having the output signal S of the first XOR gate XOR1 as an input signal may also produce glitches.

Thus, both the sum output signal SUM and the carry output signal $C_{out}$ obtained using XOR gate logic cells based on the sum logic expression (1-1) and the carry logic expression (2-2)/(2-3), respectively, will likely contain glitches.

That is, the full adders in the related art shown in FIGS. 2 and 3 are unbalanced, and both the sum output signal SUM and the carry output signal $C_{out}$ therein may contain glitches.

Furthermore, due to a similar reason, the inverted output signal $\overline{S}$, obtained by inversion of the output signal S, will likely also contain glitches. Wherein, $\overline{S}$ satisfies the following logic relationship:

$$\overline{S}=\overline{A\oplus B}=AB+\overline{AB} \quad (4).$$

That is, the XNOR logic cell is unbalanced and the logic operation performed therein may produce glitches in the output signal.

In addition, the multiplexer used by the full adder 300 shown in FIG. 3 is also unbalanced, and the logic operation performed therein may also produce glitches in the output signal.

The multiplexer MUX will be used as an example for analysis below. The output signal $C_{out}$ of the multiplexer MUX satisfies the following logic relationship:

$$C_{out}=SC_{in}+\overline{S}A \quad (2\text{-}4).$$

According to the logic expression (2-4), the signals for the logic operations of "AND", "OR" or a combination thereof in the multiplexer MUX include both the signal S and the inverted signal $\overline{S}$ obtained by inversion of the signal S. As can be seen from the above analysis in connection with the XOR gate, there is a relative delay between the signals S and $\overline{S}$, and the magnitude of this relative delay is not negligible for the logic operation in the cell, so that the output signal $C_{out}$ of the multiplexer MUX will probably contain glitches. Furthermore, according to the logic expression (2-4), the multiplexer MUX itself is unbalanced.

Furthermore, when the multiplexer MUX is used for the logic circuit of the full adder, the signal S is the output signal of the first XOR gate XOR1, and as discussed above, the signal S and its inverted signal $\overline{S}$ themselves may contain glitches, which may further increase the glitches in the output signal $C_{out}$.

Further, when the multiplexer MUX is used for the logic circuit of the full adder, the signal input to the channel selection terminal of the multiplexer MUX is the output signal S of the first XOR gate XOR1 with the signals A, B as input signals, and the signals input to the channel input terminal of the multiplexer MUX are the signal A and the signal $C_{in}$. That is, the input signals of the multiplexer MUX include both the signals A, $C_{in}$, and the signal S obtained by performing an XOR operation on the signals A and B. Since the XOR operation unit, here the first XOR gate XOR1, will introduce a certain amount of delay, there is a relative delay between the signal S/$\overline{S}$ and the signals A and $C_{in}$. Generally, the magnitude of the relative delay is not negligible for the logic operation of the logic operation unit, thereby possibly further increasing glitches in the output signal $C_{out}$. In addition, the imbalance of the first XOR gate XOR1 also increases the glitches in the output signal $C_{out}$ of the multiplexer MUX which uses S as an input signal.

Thus, the carry output signal $C_{out}$ obtained using the XOR gate and the multiplexer based on the carry logic expression (2-4) will also likely contain glitches.

Figure 4:
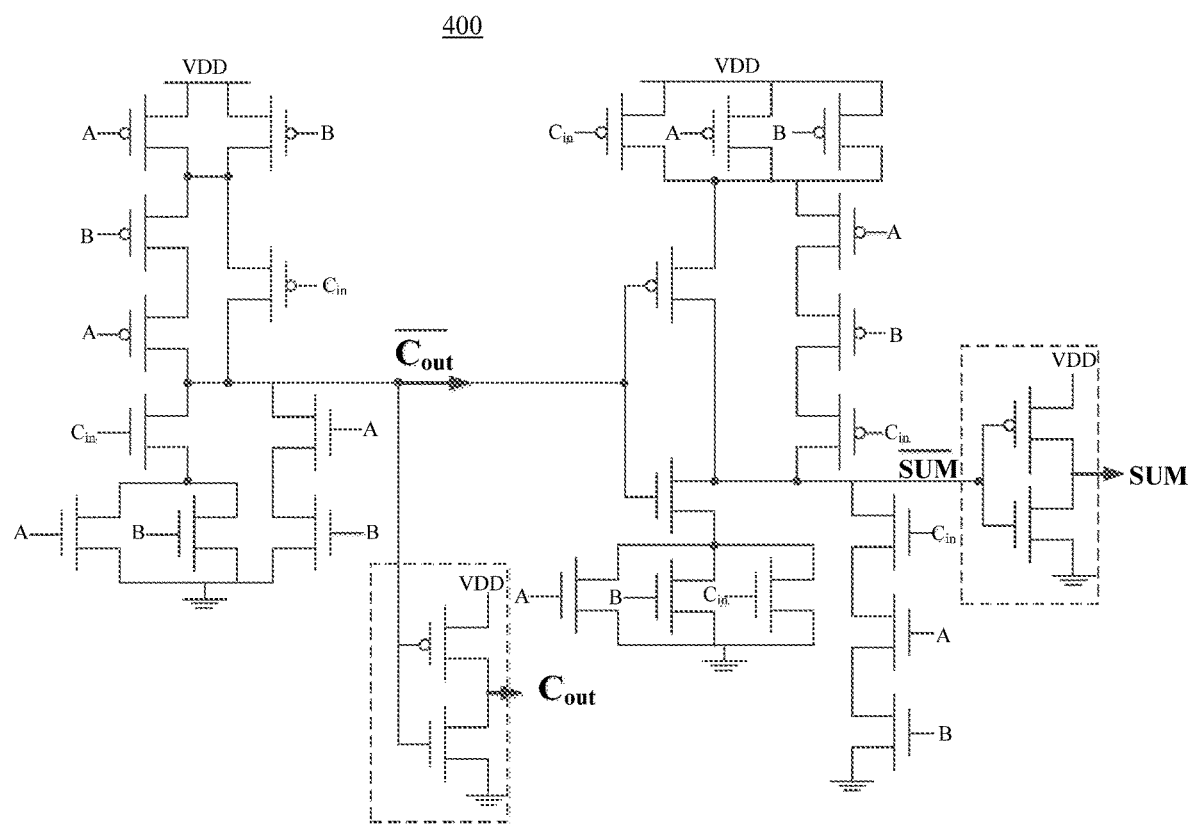
FIG. 4 shows a circuit diagram of yet another implementation of a full adder in the related art.

FIG. 4 shows a circuit diagram of yet another implementation of a full adder in the related art.

The main characteristic of the implementation shown in FIG. 4 is that the sum output signal SUM of the full adder is obtained using the carry output signal $C_{out}$ of the full adder. Specifically, the sum output signal SUM may also be expressed as:

$$SUM = ABC + (A+B+C_{in})\overline{C_{out}} \quad (1\text{-}2).$$

The full adder in FIG. 4 is implemented based on the logic relationship in the above logic expressions (1-2) and (2-1).

Advantageously, the implementation of the full adder shown in FIG. 4 avoids the use of an XOR gate or a multiplexer MUX to obtain the SUM output signal SUM and the carry output signal $C_{out}$, thus avoiding the glitches introduced by the logic cells described above.

However, the inventor of the present application has recognized that glitches may still exist in the sum output signal SUM obtained by using the sum logic expression (1-2).

Specifically, the input signal $\overline{C_{out}}$ of the sum logic operation is obtained by performing a carry logic operation on the signals A, B, $C_{in}$. That is, the signals participating in the logic operations of "AND", "OR" or a combination thereof in the above sum logic operation include both the input signals A, B, $C_{in}$ of the full adder and the signal $\overline{C_{out}}$ obtained by performing the carry logic operation on the input signals A, B, $C_{in}$. Since a certain amount of delay is introduced due to the related logic operation, there is a relative delay between the signal $\overline{C_{out}}$ and the input signals A, B, $C_{in}$. In general, the magnitude of the relative delay is not negligible for the logic operation, which may destroy the signal synchronization and thus may produce glitches in the output signal SUM.

Thus, the inventor of the present application has recognized that conventional full adders may have certain deficiencies in terms of balance and often have glitches in the output signal. It is desirable to improve the balance of the full adder and reduce glitches and thus there is a need for an improved full adder.

Various exemplary embodiments of the present disclosure will be described in detail below with reference to the drawings. It shall be noted that unless otherwise illustrated, respective arrangements, mathematic expressions and values of the components and steps illustrated in these embodiments do not limit the scope of the present disclosure.

The following descriptions on at least one illustrative embodiment are actually illustrative, but shall not set any limitation on the present disclosure or its application or utilization. In other words, the structures and methods of fabrication herein are shown by way of example to illustrate various embodiments of the structures and methods in this disclosure. Those skilled in the art, however, will understand that they are merely illustrative, instead of exhaustive, of exemplary ways in which the present disclosure may be practiced. Furthermore, the drawings are not necessarily drawn in proportion, and some features may be exaggerated to show details of particular components.

Techniques, methods and devices that have already been known to ordinary technicians in the art may not be discussed here in detail, but under suitable circumstances, the techniques, methods and devices shall be deemed as parts of the granted description.

In the embodiments shown and discussed here, any specific value shall be interpreted as only illustrative, instead of limitative. Hence, other embodiments of the illustrative embodiments may have different values.

Figure 5:
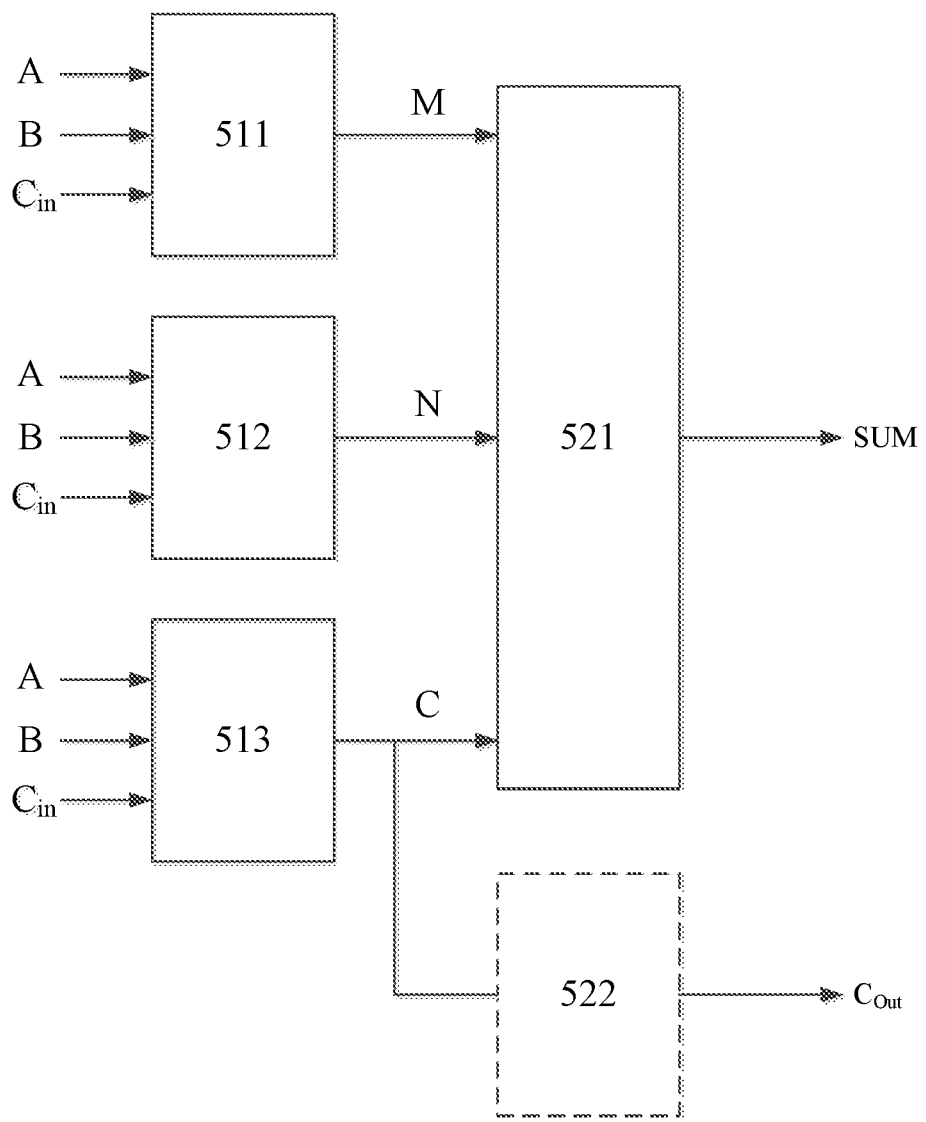
FIG. 5 shows a schematic diagram of a full adder according to one or more exemplary embodiments of the present disclosure.

FIG. 5 shows a schematic diagram of a full adder 500 according to one or more exemplary embodiments of the present disclosure.

As shown in FIG. 5, the full adder 500 includes a plurality of primary logic cells and at least one secondary logic cell. Wherein an output terminal of each primary logic cell is connected to at least an input terminal of a first secondary logic cell 521 of the at least one secondary logic cell.

In various embodiments, the plurality of primary logic cells includes a first primary logic cell 511. Wherein, the first primary logic cell 511 is configured to generate a first intermediate signal M based on the first input signal A, the second input signal B and the carry input signal $C_{in}$ input to the full adder 500.

The plurality of primary logic cells also includes a second primary logic cell 512. Wherein the second primary logic cell 512 is configured to generate a second intermediate signal N based on the first input signal A, the second input signal B and the carry input signal $C_{in}$.

In addition, the plurality of primary logic cells further includes a third primary logic cell 513. Wherein the third primary logic cell 513 is configured to generate a carry-related signal C based on the first input signal A, the second input signal B and the carry input signal $C_{in}$.

In various embodiments, the first secondary logic cell 521 is configured to generate a sum output signal SUM of the full adder 500 based on the first intermediate signal M, the second intermediate signal N, and the carry-related signal C.

In some embodiments, the at least one secondary logic cell further includes a second secondary logic cell 522, as desired.

As shown in FIG. 5, an output terminal of the third primary logic cell 513 is connected to an input terminal of the second secondary logic cell 522.

The second secondary logic cell 522 is configured to generate a carry output signal $C_{out}$ of the full adder 500 based on the carry-related signal C.

Alternatively, in some embodiments, the carry-related signal C is output directly as a carry output signal $C_{out}$ of the full adder 500.

If F11, F12, and F13 are used to represent logic relationships between the first intermediate signal M, the second intermediate signal N, and the carry-related signal C with respect to the first input signal A, the second input signal B, and the carry input signal $C_{in}$, respectively, then the logic operations performed by the first primary logic cell 511, the second primary logic cell 512 and the third primary logic cell 513 can be expressed as:

$$M = F11(A,B,C_{in}); \quad (5\text{-}1)$$

$$N = F12(A,B,C_{in}); \quad (6\text{-}1)$$

$$C = F13(A,B,C_{in}). \quad (7\text{-}1)$$

Accordingly, if F21 is used to represent a logic relationship between the sum output signal SUM with respect to the first intermediate signal M, the second intermediate signal N, and the carry-related signal C, the logic operation performed by the first secondary logic cell can be expressed as:

$$SUM = F21(M,N,C) \quad (8\text{-}1).$$

Thus, in various embodiments of the present disclosure, the sum logic expression of the full adder 500 may be derived as expression (8-1) by using the carry output signal or its related signal C, whereby logic operations are performed on the input signals A, B, $C_{in}$ and the intermediate signals M, N, C in sequentially arranged two stages of logic cells, respectively. Because the intermediate signals M, N, C have a delay relative to the input signals A, B, $C_{in}$ that is introduced by undergoing logic operations, this arrangement of two-stage logic cells advantageously avoids performing logic operations of "AND", "OR" or a combination thereof on the input signals A, B, $C_{in}$ and the intermediate signals M, N, C in the same logic cell, thereby reducing glitches in the sum output signal SUM.

Preferably, in some embodiments, the logic relationship of the output signal of each primary logic cell or the inverted output signal obtained by inversion of the output signal with respect to the input signals of the primary logic cell can be represented by a logic expression that comprises only one or both of the basic logic operators "AND" and "OR".

For example, the logic relationship of one of M or $\overline{M}$ with respect to A, B, $C_{in}$, the logic relationship of one of N or $\overline{N}$ with respect to A, B, $C_{in}$, or the logic relationship of one of C or $\overline{C}$ with respect to A, B, $C_{in}$ can be represented by a logic expression that comprises only one or both of the basic logic operators "AND" and "OR".

Thus, according to the logic operation law, the signals that participate in the logic operations of "AND", "OR" or a combination thereof in each primary logic cell exclusively includes respective input signals input to the primary logic cell or inverted input signals obtained by inverting the respective input signals.

For example, in some embodiments, the signals that participate in the logic operations of "AND", "OR", or a combination thereof in respective primary logic cell are the input signals A, B, $C_{in}$.

Alternatively, in some embodiments, the signals that participate in the logic operations of "AND", "OR" or a combination thereof in the respective primary logic cells are the inverted input signals $\overline{A}$, $\overline{B}$, $\overline{C_{in}}$.

Advantageously, the primary logic cells in these embodiments may themselves be balanced and the logic operations performed therein may themselves not produce glitches, as compared to logic cells such as the XOR gates or multiplexer used in the related art.

In some embodiments, the input signals A, B, $C_{in}$ are synchronous. That is, the input signals of the primary logic cells in these embodiments are synchronous.

Thus, in some embodiments, the intermediate signals output from the respective primary logic cells may not contain glitches.

Advantageously, the carry output signal $C_{out}$ may not contain glitches.

Preferably, in some embodiments, the logic relationship of the output signal of the first secondary logic cell or the inverted output signal obtained by inversion of the output signal with respect to the input signal of the first secondary logic cell can be represented by a logic expression that comprises only one or both of the basic logic operators "AND" and "OR".

For example, the logic relationship of one of SUM or $\overline{SUM}$ with respect to M, N, C can be expressed by a logic expression that comprises only one or both of the basic logic operators "AND" and "OR".

Thus, according to the logic operation law, the signals that participate in the logic operations of "AND", "OR" or a combination thereof in the first secondary logic cell exclusively includes the respective intermediate signals input to the first secondary logic cell or the inverted intermediate signals obtained by the inversion of the respective intermediate signals.

For example, in some embodiments, the signals that participate in the logic operations of "AND", "OR" or a combination thereof in the first secondary logic cell are the intermediate signals M, N, C.

Alternatively, in some embodiments, the signals that participate in the logic operations of "AND", "OR", or a combination thereof in the first secondary logic cell are the inverted input signals $\overline{M}$, $\overline{N}$, $\overline{C}$.

Advantageously, the first secondary logic cells in these embodiments may be balanced and the logic operations performed therein may themselves not produce glitches, as compared to logic cells such as the XOR gates or multiplexer used in the related art.

Preferably, in some embodiments, the first intermediate signal M, the second intermediate signal N and the carry-related signal C are synchronized in time. That is, the input signals of the first secondary logic cells in these embodiments are synchronized in time.

Thus, in some embodiments, the sum output signal output from the first secondary logic cell may not contain glitches.

Alternatively, in some embodiments, at least a portion of the first intermediate signal M, the second intermediate signal N and the carry-related signal C are synchronized in time.

For example, in some embodiments, the first intermediate signal M is synchronized with the second intermediate signal N in time.

Furthermore, in some embodiments, the first intermediate signal M, the second intermediate signal N and the carry-related signal C are substantially synchronized in time.

As will be readily understood by those skilled in the art, substantial synchronization of two or more signals in time means that the delay between the signals is negligible relative to the time of logic operations in which the signals participate, and thus, the correspondingly generated glitches do not have a significant effect on the quality of the output signal.

Optionally, in some embodiments, the full adder 500 also includes a delay member (not shown). The delay member is arranged to synchronize in time the first intermediate signal M, the second intermediate signal N and the carry-related signal C.

As analyzed in detail above, the full adder 500 according to one or more embodiments of the present disclosure reduces glitches in the output signal and improves the balance of the full adder 500 by the following aspects.

First, by means of the carry output signal or its related signal C, the input signals A, B, $C_{in}$ and the intermediate signals M, N, C are logically operated in two stages of logic cells (primary logic cells and secondary logic cell(s)) sequentially arranged, respectively.

Second, each primary logic cell and the first secondary logic cell are required to meet the following requirements: the logic relationship of the output signal of a logic cell or the inverted output signal obtained by inversion of the output signal with respect to the input signal of the logic cell can be represented by a logic expression that comprises only one or both of the basic logic operators "AND" and "OR".

Thus, the signals participating in logic operations of "AND", "OR", or a combination thereof in the logic cell includes exclusively the respective signals input to the logic cell or the inverted signals obtained by inverting the respective signals.

The above two aspects can advantageously improve the balance of each primary logic cell and the first secondary logic cell, and thus the balance of the full adder 500, and the logic operations performed in each primary logic cell and the first secondary logic cell themselves may not produce glitches.

Finally, the signals input to the same logic cell are required to be synchronized or substantially synchronized in time. Where the intermediate signals output from the respective primary logic cells may not contain glitches if the respective signals A, B, $C_{in}$ input to the same primary logic cell are synchronized. Accordingly, the output signal $C_{out}$ of the second secondary logic cell may not contain glitches.

Preferably, in some embodiments, each intermediate signal M, N input to the first secondary logic cell is required to be synchronized or substantially synchronized in time with C. Thus, the output signal SUM of the first secondary logic cell may contain no or substantially no glitches.

Figure 6:
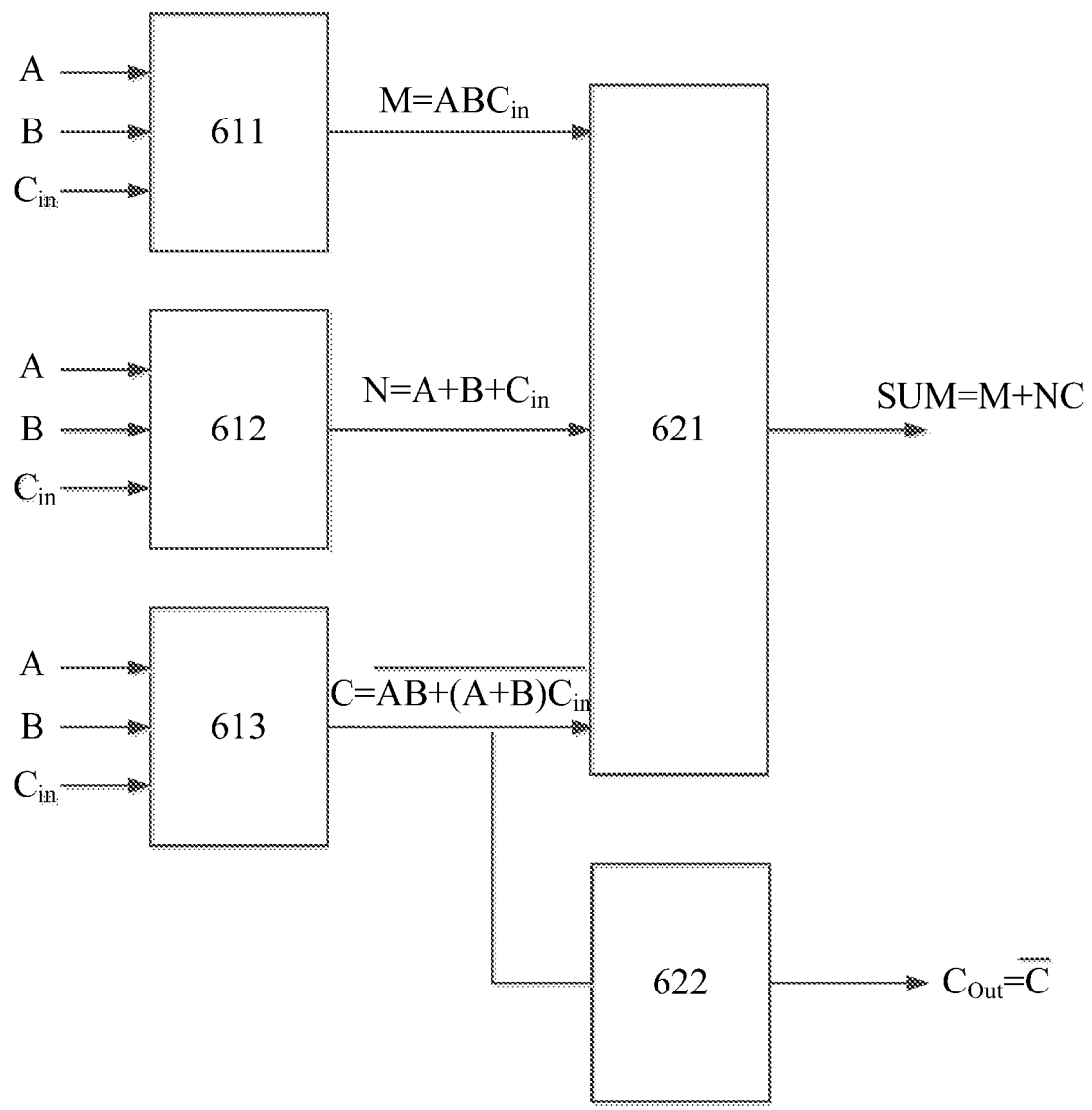
FIG. 6 shows a schematic diagram of a full adder according to a first embodiment of the present disclosure.

FIG. 6 shows a schematic diagram of a full adder 600 according to a first embodiment of the present disclosure.

As shown in FIG. 6, the full adder 600 includes a first primary logic cell 611, a second primary logic cell 612, a third primary logic cell 613, and a first secondary logic cell 621.

Wherein output terminals of the respective primary logic cells 611, 612, 613 are connected to an input terminal of the first secondary logic cell 621.

In addition, the full adder 600 also includes a second secondary logic cell 622.

Wherein the output terminal of the third primary logic cell 613 is connected to an input terminal of the second secondary logic cell 622.

In the first embodiment, as shown in FIG. 6, the logic operation performed by the first primary logic cell 611 can be expressed as:

$$M=ABC_{in} \quad (5\text{-}2);$$

The logic operation performed by the second primary logic cell 612 can be expressed as:

$$N=A+B+C_{in} \quad (6\text{-}2); \text{ and}$$

The logic operation performed by the third primary logic cell 613 can be expressed as:

$$C=\overline{AB+(A+B)C_{in}} \quad (7\text{-}2).$$

On this basis, the logic operation performed by the first secondary logic cell 621 can be expressed as:

$$\text{SUM}=M+NC \quad (8\text{-}2).$$

Also, the logic operation performed by the second secondary logic cell 622 can be expressed as:

$$C_{out}=\overline{C} \quad (9).$$

In some embodiments, the second secondary logic cell 622 may be an inverter.

Compared to the full adder in the related art, the full adder 600 according to the present embodiment can advantageously reduce glitches in the output sum signal SUM and the carry signal $C_{out}$ and improve the balance of the full adder.

First, by means of an inverted signal C of the carry output signal $C_{out}$, the full adder 600 performs a logic operation on the input signals A, B, $C_{in}$ and the intermediate signals M, N, C in sequentially arranged primary logic cells 611, 612, 613 and secondary logic cells 621, 622, respectively. Advantageously, this two-stage arrangement of logic cells avoids the logic operations of "AND", "OR", or a combination thereof on the input signals A, B, $C_{in}$ and the intermediate signals M, N, C in the same logic cell.

Second, as shown in logic expressions (5-2)-(7-2), the logic relationship of the intermediate signals or inverted intermediate signals M, N, $\overline{C}$ of the full adder 600 with respect to the input signals A, B, $C_{in}$ can be represented by a logic expression that comprises only one or both of the basic logic operators "AND" and "OR".

Similarly, as shown in logic expression (8-2), the logic relationship of the sum output signal SUM output from the first secondary logic cell 621 of the full adder 600 with respect to the input intermediate signals M, N, C can be represented by a logic expression that comprises only one or both of the basic logic operators "AND" and "OR".

Further, as shown in logic expression (9), the second secondary logic cell 622 of the full adder 600 only inverts the intermediate signal C.

Thus, the respective primary/secondary logic cells in the full adder 600 according to the present embodiment are themselves balanced, and the full adder 600 is also balanced as a whole. Also, the logic operations performed in respective primary/secondary logic cells themselves may not produce glitches.

In some embodiments, the input signals A, B, $C_{in}$ are synchronous. Thus, in some embodiments, the intermediate signals M, N, C output from the respective primary logic cells 611, 612, 613 may not contain glitches.

Therefore, the carry output signal $C_{out}$ of the full adder 600 according to the present embodiment may not contain glitches.

As can be seen by comparing the logic expressions (5-2)-(7-2) of the primary logic cells 611, 612, 613, the intermediate signal M and the intermediate signal N may be synchronized in time, and relatively, there may be a small amount of delay between the intermediate signals M, N and the intermediate signal C.

In some embodiments, the delay between the intermediate signals M, N and the intermediate signal C may be on the order of 10 ps.

Thus, it can be considered that the intermediate signals M, N and the intermediate signal C are substantially synchronized in time.

Therefore, the sum output signal SUM of the full adder 600 according to the present embodiment can substantially contain no glitches.

Optionally, in some embodiments, delay control can be performed on some of the intermediate signals M, N and C to synchronize them in time.

Figure 7:
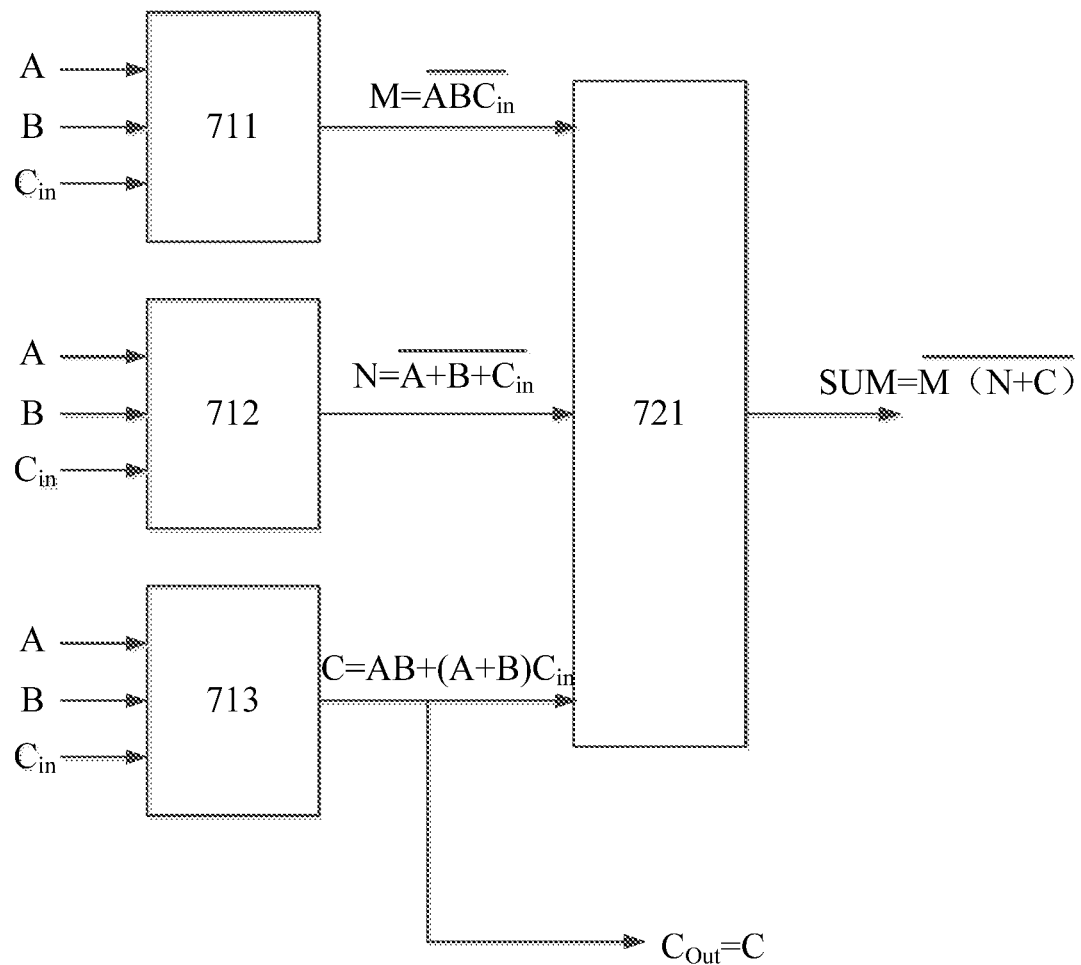
FIG. 7 shows a schematic diagram of a full adder according to a second embodiment of the present disclosure.

FIG. 7 shows a schematic diagram of a full adder 700 according to a second embodiment of the present disclosure.

As shown in FIG. 7, the full adder 700 includes a first primary logic cell 711, a second primary logic cell 712, a third primary logic cell 713, and a first secondary logic cell 721.

Wherein output terminals of the respective primary logic cells 711, 712, 713 are connected to an input terminal of the first secondary logic cell 721.

In the second embodiment, as shown in FIG. 7, the logic operation performed by the first primary logic cell 711 can be expressed as:

$$M = \overline{ABC_{in}} \quad (5\text{-}3);$$

The logic operation performed by the second primary logic cell 712 can be expressed as:

$$N = \overline{A + B + C_{in}} \quad (6\text{-}3); \text{ and}$$

The logic operation performed by the third primary logic cell 713 can be expressed as:

$$C = AB + (A+B)C_{in} \quad (7\text{-}3).$$

On this basis, the logic operation performed by the first secondary logic cell 721 can be expressed as:

$$SUM = \overline{M(N+C)} \quad (8\text{-}3).$$

Also, as shown in FIG. 7, in the second embodiment, the intermediate signal C output from the third primary logic cell 713 is directly output as the carry output signal $C_{out}$ of the full adder 700.

Compared to the full adder in the related art, the full adder 700 according to the present embodiment can also advantageously reduce glitches in the output sum signal SUM and the carry signal $C_{out}$ and improve the balance of the full adder.

First, the full adder 700 performs a logic operation on the input signals A, B, $C_{in}$ and the intermediate signals M, N, C in sequentially arranged primary logic cells 711, 712, 713 and secondary logic cell 721, respectively, by means of carry output signal $C_{out}$. Advantageously, this two-stage arrangement of logic cells avoids the logic operations of "AND", "OR", or a combination thereof on the input signals A, B, $C_{in}$ and the intermediate signals M, N, C in the same logic cell.

Second, as shown in logic expressions (5-3)-(7-3), the logic relationship of the intermediate signals or inverted intermediate signals $\overline{M}$, $\overline{N}$, C of the full adder 700 with respect to the input signals A, B, $C_{in}$ can be represented by a logic expression that comprises only one or both of the basic logic operators "AND" and "OR".

Similarly, as shown in logic expression (8-3), the logic relationship of the inverted signal $\overline{SUM}$ of the sum output signal SUM output from the first secondary logic cell 721 of the full adder 700 with respect to the input intermediate signals M, N, C can be represented by a logic expression that comprises only one or both of the basic logic operators "AND" and "OR".

Thus, respective primary/secondary logic cells in the full adder 700 according to the present embodiment are themselves balanced, and the full adder 700 is also balanced as a whole. Also, the logic operations themselves performed in respective primary/secondary logic cells may not generate glitches.

In some embodiments, the input signals A, B, $C_{in}$ are synchronous. Thus, in some embodiments, the intermediate signals M, N, C output from the respective primary logic cells 711, 712, 713 may not contain glitches.

Therefore, the carry output signal $C_{out}$ of the full adder 700 according to the present embodiment may not contain glitches.

As can be seen by comparing the logic expressions (5-3)-(7-3) of the primary logic cells 711, 712, 713, the intermediate signal M and the intermediate signal N may be synchronized in time, and relatively, there may be a small amount of delay between the intermediate signals M, N and the intermediate signal C.

In some embodiments, the delay between the intermediate signals M, N and the intermediate signal C may be on the order of 10 ps.

Thus, it can be considered that the intermediate signals M, N and the intermediate signal C are substantially synchronized in time.

Therefore, the sum output signal SUM of the full adder 700 according to the present embodiment can substantially contain no glitches.

Optionally, in some embodiments, delay control can be performed on some of the intermediate signals M, N and C to synchronize them in time.

In addition, the full adder 700 according to the present embodiment can further reduce glitches in the output signal and reduce the occupied area of the device, compared to the full adder 600 according to the first embodiment.

As shown in the circuit diagram of FIG. 4, the logic cells are typically implemented in the form of "NAND" and "NOR" instead of "AND" and "OR". Thus, compared with the circuits in the primary logic cells 611, 612 of the full adder 600 for implementing the logic operations (5-2)-(6-2), the circuits in the primary logic cells 711, 712 of the full adder 700 for implementing the logic operations (5-3)-(6-3) are simpler. In some embodiments, the circuits in the primary logic cells 611, 612 in the full adder 600 each requires an additional inverter, which increases the relative delay between the intermediate signals M, N and the intermediate signal C and increases the occupied area for arranging the inverter.

In addition, the full adder 600 also requires the use of inverter 622 to obtain both the intermediate signal C and the carry output signal $C_{out}$, thereby further increasing the occupied area for arranging the inverter.

It is noted that in some embodiments, the circuit used to implement the logic operation (7-3) in the full adder 700 and the circuit used to implement the logic operation (7-2) in the full adder 600 both can employ common logic cells for obtaining carry output signals, and they may differ slightly in size and operation time.

In summary, the full adder 700 according to the present embodiment can further reduce glitches in the output signal and reduce the occupied area of the device, compared to the full adder 600 according to the first embodiment.

Those skilled in the art will readily appreciate that while the above two embodiments of the full adder are described herein, the full adder according to the present disclosure is not so limited, but may be adjusted as desired.

The full adder according to the present disclosure may be implemented in various suitable manners, such as in software, hardware, a combination of software and hardware, and so on.

In one implementation, a chip may include the full adder as described above. The chip may also be included in a computing device.

The terms "front", "back", "top", "bottom", "over", "under" and the like in the description and in the claims, if any, are used for descriptive purposes and not necessarily for describing constant relative positions. It is to be understood that the terms thus used are interchangeable under appropriate circumstances such that the embodiments of the disclosure as described herein are, for example, capable of being operated in other orientations different than those as illustrated or otherwise described herein.

As used herein, the word "exemplary" means "serving as an example, instance, or illustration", instead of serving as a "model" that is to be accurately reproduced. Any implementation illustratively described herein is not necessarily to be construed as preferred or advantageous over other implementations. Furthermore, the present disclosure is not limited by any expressed or implied theory presented in the preceding parts of Technical Field, Background Art, Contents of the Invention or Embodiment.

As used herein, the term "substantially" is intended to encompass any minor variation caused by design or manufacturing imperfections, tolerances of devices or components, environmental influences, and/or other factors. The word "substantially" also allows for differences from a perfect or ideal situation due to parasitics, noise, and other practical considerations that may exist in a practical implementation.

In addition, the foregoing description may mention elements or nodes or features being "connected" or "coupled" together. As used herein, the term "connected" means one element/node/feature is electronically, mechanically, logically or otherwise directly linked (or directly communicates) with another element/node/feature, unless otherwise illustrated. Similarly, unless otherwise illustrated, the term "coupling" means one element/node/feature may be mechanically, electronically, logically or otherwise linked to another element/node/feature in a directly or indirect manner to allow an interaction therebetween, even if these two features may not be linked directly. In other words, the term "coupling" intends to include directly links and indirect links between elements or other features, including connections through one or more intermediate elements.

Additionally, for reference purposes only, similar terms as "first", "second" and the like may also be used herein, and thus are not intended to be limiting. For example, the terms "first", "second" and other such numerical terms relating to structures or elements do not imply a sequence or order unless clearly indicated by the context.

It will be further understood that the term "comprising/including", when used herein, specifies the presence of stated features, integers, steps, operations, units and/or components, but the presence or addition of one or more other features, integers, steps, operations, units and/or components, and/or combinations thereof is not excluded.

In the present disclosure, the term "providing" is used in a broad sense to cover all ways of obtaining an object, and thus "providing an object" includes, but is not limited to, "purchasing", "preparing/fabricating", "arranging/setting", "installing/assembling", and/or "ordering" an object, etc.

It shall be realized by those skilled in the art that boundaries between said operations are only illustrative. Multiple operations may be combined into a single operation, and a single operation may be distributed in additional operations, and moreover, the operations may be performed in an at least partially overlapping manner in time. Furthermore, optional embodiments may include multiple examples of specific operations, and the operation sequence may be changed in various other embodiments. However, other modifications, changes and replacements are also possible. Thus, the description and drawings shall be deemed as illustrative instead of limitative.

Although some specific embodiments of the present disclosure have been exemplified in detail, it shall be understood by those skilled in the art that the above examples are only illustrative, but shall by no means limit the scope of the present disclosure. The respective examples of the disclosure may be combined in any manner, without departure from spirits and scope of the present disclosure. It shall further be understood by those skilled in the art that multiple amendments may be made to the examples, without departure from the scope and spirits of the present disclosure. The scope of the present disclosure is defined by the attached claims.

What is claimed is:

1. A full adder, comprising:
   a plurality of primary logic cells and at least one secondary logic cell, wherein an output terminal of each primary logic cell is at least connected to an input terminal of a first secondary logic cell of the at least one secondary logic cell,
   the plurality of primary logic cells comprising:
   a first primary logic cell configured to generate a first intermediate signal M based on a first input signal A, a second input signal B, and a carry input signal $C_{in}$ input to the full adder;
   a second primary logic cell configured to generate a second intermediate signal N based on the first input signal A, the second input signal B, and the carry input signal $C_{in}$; and
   a third primary logic cell configured to generate a carry-related signal C based on the first input signal A, the second input signal B and the carry input signal $C_{in}$, and
   the first secondary logic cell being configured to generate a sum output signal SUM of the full adder based on the first intermediate signal M, the second intermediate signal N, and the carry-related signal C.

2. The full adder according to claim 1, wherein a logic relationship of an output signal of each primary logic cell, or an inverted output signal obtained by inversion of the output signal with respect to an input signal of the primary logic cell can be represented by a logic expression that comprises only one or both of basic logic operators "AND" and "OR".

3. The full adder according to claim 1, wherein a logic relationship of an output signal of the first secondary logic cell, or an inverted output signal obtained by inversion of the output signal with respect to an input signal of the first secondary logic cell can be represented by a logic expression that comprises only one or both of basic logic operators "AND" and "OR".

4. The full adder according to claim 1, wherein at least a portion of the first intermediate signal M, the second intermediate signal N and the carry-related signal C are synchronized in time.

5. The full adder according to claim 1, further comprising a delay member for synchronizing in time the first intermediate signal M, the second intermediate signal N and the carry-related signal C.

6. The full adder according to claim 1, wherein the at least one secondary logic cell further comprises a second secondary logic cell,
wherein an output terminal of the third primary logic cell is configured to be connected to an input terminal of the second secondary logic cell, and
the second secondary logic cell is configured to generate a carry output signal $C_{out}$ of the full adder based on the carry-related signal C.

7. The full adder according to claim 6, wherein
a logic operation performed by the first primary logic cell can be expressed as: $M=ABC_{in}$;
a logic operation performed by the second primary logic cell can be expressed as: $N=A+B+C_{in}$;
a logic operation performed by the third primary logic cell can be expressed as: $C=\overline{AB+(A+B)C_{in}}$; and
a logic operation performed by the first secondary logic cell can be expressed as: SUM=M+NC.

8. The full adder according to claim 6, wherein
a logic operation performed by the second secondary logic cell can be expressed as: $C_{out}=\overline{C}$.

9. The full adder according to claim 1, wherein the carry-related signal C can be output as a carry output signal $C_{out}$ of the full adder.

10. The full adder according to claim 9, wherein
a logic operation performed by the first primary logic cell can be expressed as: $M=\overline{ABC_{in}}$;
a logic operation performed by the second primary logic cell can be expressed as: $N=\overline{A+B+C_{in}}$;
a logic operation performed by the third primary logic cell can be expressed as: $C=AB+(A+B)C_{in}$; and
a logic operation performed by the first secondary logic cell can be expressed as: SUM=$\overline{M(N+C)}$.

11. A chip, wherein the chip comprises the full adder according to claim 1.

12. A computing device, wherein the computing device comprises the chip of claim 11.

* * * * *